United States Patent
Tan et al.

[11] Patent Number: 5,815,031
[45] Date of Patent: Sep. 29, 1998

[54] HIGH DENSITY DYNAMIC BUS ROUTING SCHEME

[75] Inventors: Teik-Chung Tan; Stephen C. Kromer, both of Austin; Joe Peters, Buda, all of Tex.

[73] Assignee: Advanced Micro Devices, Inc., Sunnyvale, Calif.

[21] Appl. No.: 878,682

[22] Filed: Jun. 19, 1997

Related U.S. Application Data

[63] Continuation of Ser. No. 655,679, Jun. 3, 1996, abandoned, which is a continuation of Ser. No. 140,671, Oct. 21, 1993, abandoned.

[51] Int. Cl.$^6$ .............. H03B 1/00; H03K 17/16; H03K 17/62
[52] U.S. Cl. .............. 327/551; 327/379; 327/403; 326/21
[58] Field of Search .............. 327/565, 566, 327/551, 379, 395, 400, 403, 269; 326/21

[56] References Cited

U.S. PATENT DOCUMENTS

| | | | |
|---|---|---|---|
| 4,472,643 | 9/1984 | Furuyama | 327/298 |
| 4,874,968 | 10/1989 | Brockmann | 327/566 |
| 4,883,980 | 11/1989 | Morimoto et al. | 327/565 |
| 4,890,022 | 12/1989 | Endo | 327/269 |
| 5,073,729 | 12/1991 | Greene et al. | 327/565 |
| 5,175,515 | 12/1992 | Abernathy et al. | 327/565 |
| 5,306,967 | 4/1994 | Dow | 327/551 |
| 5,307,286 | 4/1994 | Rusu et al. | 327/565 |
| 5,341,049 | 8/1994 | Shimizu | 327/565 |
| 5,357,456 | 10/1994 | Fukuda | 364/784 |

FOREIGN PATENT DOCUMENTS

| | | |
|---|---|---|
| 62060255 | 7/1983 | Japan . |
| 2065240 | 8/1995 | Japan . |

*Primary Examiner*—David C. Nelms
*Assistant Examiner*—Trong Phan
*Attorney, Agent, or Firm*—Jenkens & Gikhrist, P.C.

[57] ABSTRACT

An improved signal line routing scheme includes a plurality of dynamic signal lines disposed in parallel to each other, and a plurality of static signal lines disposed in parallel to each other and also disposed in parallel with the plurality of dynamic signal lines, wherein at least one of the plurality of static signal lines is disposed immediately adjacent to each one of the plurality of dynamic signal lines.

6 Claims, 3 Drawing Sheets

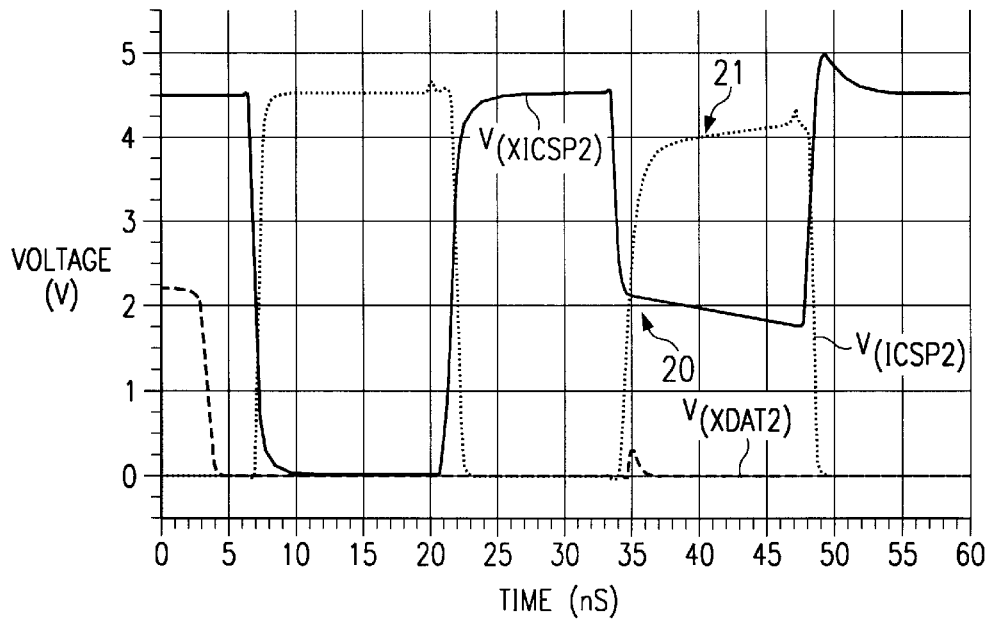
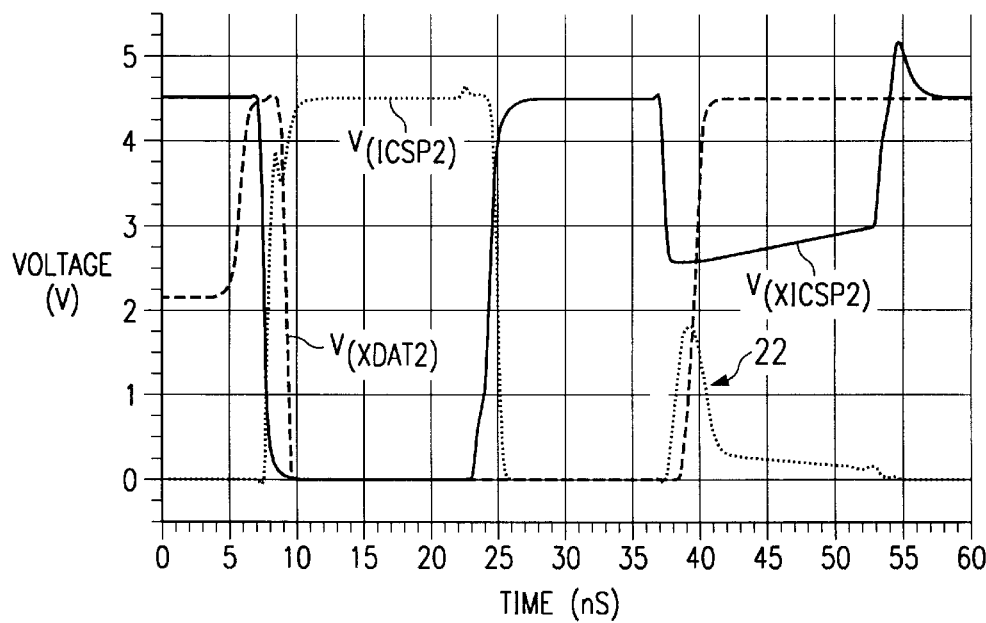

HIGH DENSITY DYNAMIC BUS ROUTING SCHEME

This application is a continuation of application Ser. No. 08/655,679, filed on Jun. 3, 1996, now abandoned, which is a continuation of application Ser. No. 08/140,671, filed on Oct. 21, 1993, now abandoned.

BACKGROUND OF THE INVENTION

1. Field of the Invention

The present invention relates to data transmission schemes, and, more particularly, to data transmission schemes including mechanisms for reducing unwanted coupling between signal paths.

2. Description of Related Art

For any data transmission event, a received signal consists of the transmitted signal, modified by various distortions imposed by the transmission signal, plus additional unwanted signals that are inserted somewhere between transmission and reception. The latter, undesired signals are referred to as noise. It is noise that is the major limiting factor in communications system performance.

Noise may generally be divided into four categories: thermal noise, intermodulation noise, impulse noise and crosstalk. Each of these four categories of noise is discussed in an individual paragraph immediately below.

Thermal noise is noise caused by thermal agitation of electrons in a conductor. It is present in all electronic devices and transmission media and is a function of temperature. Thermal noise is uniformly distributed across the frequency spectrum and hence is often referred to as white noise. Thermal noise cannot be eliminated and therefore places an upper bound on communications system performance.

Intermodulation noise can arise when signals at different frequencies share the same transmission medium. The effect of intermodulation noise is to produce signals at a frequency which is the sum or difference of the two original frequencies or multiples of those frequencies. Intermodulation noise is produced when there is some nonlinearity in the transmitter, receiver, or intervening transmission system. Nonlinearity can be caused by component malfunction or by use of excessive signal strength.

Impulse noise is unpredictable and noncontinuous, consisting of irregular pulses or noise spikes of short duration and of relatively high amplitude. It may be generated from a variety of causes, including external electromagnetic disturbances, such as lightening, and faults and flaws in the communications system.

Crosstalk, the fourth major category of noise, is an unwanted coupling between signal paths. There is inevitably a certain amount of parasitic capacitance between long lines routed in parallel. This capacitance can cause coupling problems; specifically, a line can unintentionally change polarity if adjacent lines change, resulting in incorrect data being transferred.

Historically, crosstalk has been generally considered to be a problem of the same order of magnitude as, or less than, thermal noise. Crosstalk has also been considered to be much less of a problem than impulse noise, which has been generally regarded to be the primary source of error in digital data communication. However, as greater densities and smaller geometries have become increasingly sought and obtained in integrated circuit (IC) manufacture, crosstalk has become a more significant problem. Current trends in IC manufacture have caused parasitic capacitance increases following spacing decreases and line length increases. This has, in turn, exacerbated crosstalk in those circuits.

An example of how crosstalk can arise may be helpful at this point. Supposing there are three dynamic lines—DYNAMIC1, DYNAMIC2, and DYNAMIC3—that are precharged to one (1), and further supposing that the data being transferred on the lines is zero (0), one (1) and zero (0), respectively: the two zeros (0s) on DYNAMIC1 and DYNAMIC3 can cause the data on DYNAMIC2 to change from one (1) to (0) through coupling.

Heretofore, those skilled in the art have attempted to reduce coupling problems by changing the ratios of the gates which receive the dynamic data, that is, by changing their threshold voltages. However this technique has made the gates slower and more susceptible to signal noise. This technique also often costs more die area. A second solution has been to increase spacing between bus lines. This definitely requires additional die area, which means larger dies must be used, and increases costs.

Based upon the foregoing, those skilled in the art should understand and appreciate that it is a shortcoming and deficiency of the prior art that there has not yet been developed a data transmission routing scheme for small, dense circuits which does not suffer from coupling problems.

SUMMARY OF THE INVENTION

The present invention overcomes the shortcoming and deficiency mentioned above by providing an improved signal line routing scheme for apparatus having dynamic signal lines and static signal lines. The signal line routing scheme provided by the present invention includes a plurality of dynamic signal lines disposed in parallel to each other, and a plurality of static signal lines disposed in parallel to each other and also disposed in parallel with the plurality of dynamic signal lines, wherein at least one of the plurality of static signal lines is disposed immediately adjacent to each one of the plurality of dynamic signal lines.

In embodiments of the present invention, at least two of the plurality of static signal lines may be disposed immediately adjacent to each one of the plurality of dynamic signal lines.

Embodiments of the present invention may also include structure, such as an analog delay element, for ensuring that an immediately adjacent dynamic signal line and static signal line do not change signal level simultaneously. This structure may be disposed on either the dynamic signal line or the static signal line.

The present invention also provides a method for routing signal lines in an apparatus having dynamic signal lines and static signal lines. The method provided by the present invention includes the steps of laying a plurality of dynamic signal lines parallel to each other; and laying a plurality of static signal lines in parallel to each other and also in parallel with the plurality of dynamic signal lines, and further so that at least one of the plurality of static signal lines is disposed immediately adjacent to each one of the plurality of dynamic signal lines.

Accordingly, it is an object of the present invention to eliminate crosstalk between long adjacent dynamic lines in a high density layout.

Another object of the present invention is to provide a scheme and method for eliminating crosstalk between long adjacent dynamic lines, which scheme and method does not require increasing the die area.

Still yet another object of the present invention is to provide an inexpensively implemented scheme to reduce problems caused by parasitic capacitance in high density layouts.

BRIEF DESCRIPTION OF THE DRAWINGS

Other objects, advantages, and novel features of the present invention will become apparent from the following detailed description of the invention when considered in conjunction with the accompanying drawings in which:

FIG. 4 depicts simulated failure in the circuit of FIG. 3 because of insufficient distances between dynamic lines; and FIG. 5 depicts simulated proper action in the circuit of FIG. 3 because the dynamic lines therein were spaced apart sufficiently.

DETAILED DESCRIPTION OF THE INVENTION

Figure 1:
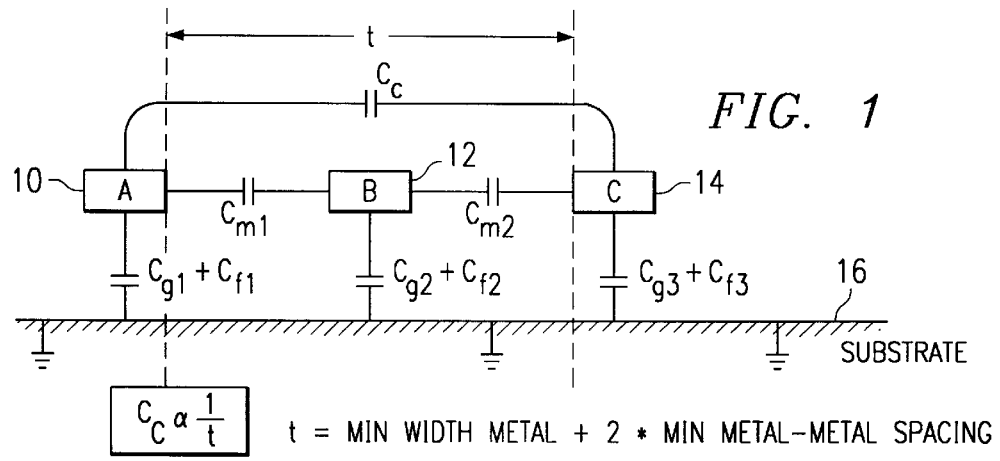
FIG. 1 is a cross sectional view of a signal line routing scheme according to the teachings of the present invention.

Referring now to the drawings wherein like reference numerals designate the same or similar elements throughout the several views, and further wherein the various elements shown are not necessarily drawn to scale, FIG. 1 depicts a signal line routing scheme according to the teachings of the present invention. Three distinct signal lines are depicted in FIG. 1. Those signal lines are dynamic signal line A 10 which carries a dynamic signal, static signal line B 12, and dynamic signal line C 14. Also depicted in FIG. 1 are capacitances among the various lines, i.e., capacitance $C_{m1}$ between dynamic line 10 and static line 12, capacitance $C_{m2}$ between static line 12 and dynamic line 14, and capacitance $C_C$ between dynamic line 10 and dynamic line 14. Capacitances between the various lines and an underlying substrate 16 are also depicted in FIG. 1, i.e., capacitance $C_{g1}+C_{f1}$ between dynamic line 10 and the substrate 16, capacitance $C_{g2}+C_{f2}$ between static line 12 and the substrate 16, and capacitance $C_{g3}+C_{f3}$ between dynamic line 14 and the substrate 16. Additionally, FIG. 1 provides some indication of appropriate spacings in embodiments of the present invention. As previously mentioned, it is generally desired to keep the capacitance $C_C$ as low as possible. Capacitance $C_C$ is, as indicated in FIG. 1, directly proportional to 1/t, where t is equal to the minimum width of the metal plus two times the minimum metal-to-metal spacing. With that it mind, it may be noted in FIG. 1 that the inventors of the present invention have found about 1.05 microns to be a suitable distance to put between a dynamic line and a static line (i.e., lines 10 and 12 in FIG. 1).

In somewhat more detail, as those skilled in the art are generally aware, dynamic signal lines are precharged high during a first phase, and then evaluated during a second, subsequent phase. Multiple sources or gates are generally present and able to pull down the dynamic signal. If none of the sources are on, the dynamic signal should remain high. This is when parasitic coupling can cause problems. When a given dynamic signal line that should remain high is surrounded by two dynamic lines being pulled low, charge may be pulled out of the surrounded dynamic line. This inherently causes current to drain out of the surrounded dynamic line, possibly even to the point that it can be effectively, and improperly, pulled low.

In general, the scheme proposed herein and depicted in FIG. 1 is based upon the concept of alternating dynamic signal lines with static signal lines. As those skilled in the art are aware, there are often sufficient static signal lines routed along a dynamic bus to control the driving and latching of the bus. According to the teachings of the present invention, any static line may be disposed so as to separate one dynamic line from another as long as it does not change at the same time as the dynamic bus. If a static signal line does change at the same time as the dynamic bus, a slight analog delay can be added to either the static signal or the bus so they change at different times.

Given a plurality of static and dynamic signals to route in parallel, a preferred embodiment (not shown for clarity) of the present invention would be DYNAMIC1, STATIC1, DYNAMIC2, STATIC2, DYNAMIC3, STATIC3. If there are not enough static signals, another option (not shown for clarity) would be to route DYNAMIC1, DYNAMIC2, STATIC1, DYNAMIC3, DYNAMIC4, STATIC2. This option, which effectively ensures that no dynamic line is immediately adjacent in the same plane to two other dynamic lines, could often be sufficient to reduce the parasitic capacitance enough to eliminate any crosstalk problem.

Figure 2A:
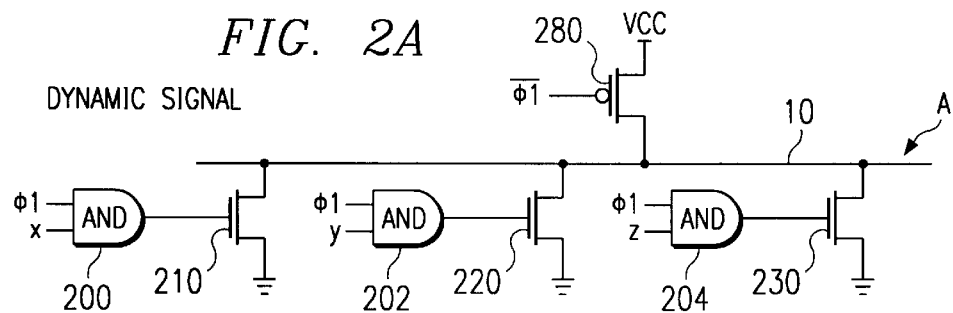
FIG. 2 (which consists of FIGS. 2A, 2B, and 2C) depicts a dynamic line A, a static line B, and a dynamic line C.
Figure 2B:
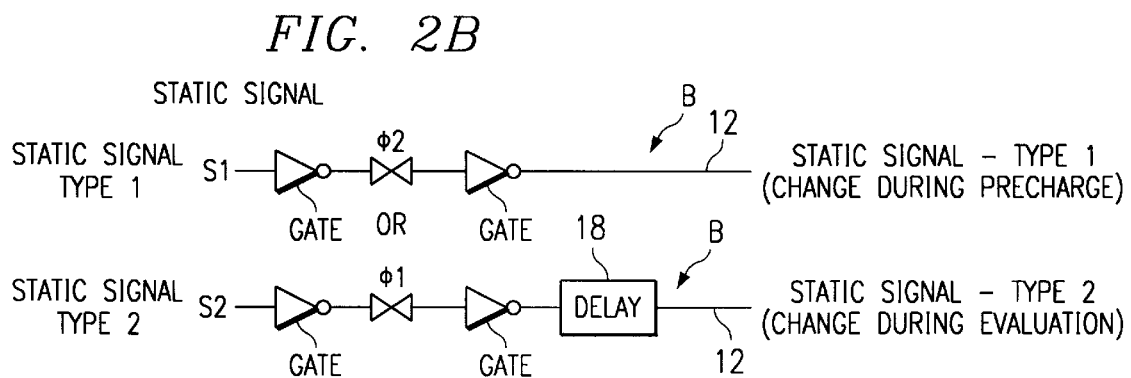
Figure 2C:
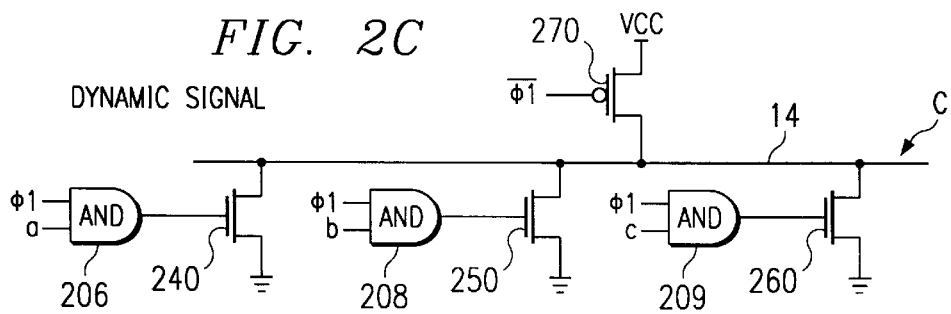

Referring now to FIG. 2 there is shown an alternative, and more detailed view, of the lines 10, 12, 14 introduced in FIG. 1. In all the FIGS. 2A–2C AND gates 200, 202, 204, 206, 208 and 209 accept the signal as noted and these gates drive a driving transistor respectively of 210, 220, 230, 240, 250, 260 with a line being driven by the inverse of the signal by transistors 280 and 270 respectively. The gating of the two static signal types in FIG. 2B is as shown in the FIGURE. More specifically, FIG. 2A is a detailed view of the dynamic signal line 10, which uses a driving transistor as shown which is fed by the signal $\overline{\phi 1}$ and for which the inverse ($\phi 1$) is supplied to the gates as shown and in which the signals x, y and z are supplied to the three gates as indicated. The upper portion of FIG. 2B is a detailed view of a static signal line 12 that changes at a different time from the adjacent dynamic signal lines 10, 14. It should be noted that the Static Signal Line Type 1 receives a static signal called s1 through the gates shown and the bottom signal line receives a static type signal which is labeled as type 2. The $\phi 1$ and $\phi 2$ shown in FIG. 2b are or gates and in FIG. 2c the various transistors are driven by or gates having a signal $\phi 1$ and signals a, b and c, with the signal $\overline{\phi 1}$ used to control the transistor which provides the dynamic pull-up similar to that shown in FIG. 2a. The lower portion of FIG. 2B is a detailed view of a static signal line 12 that changes at the same time as one or both of the adjacent static signal lines 10, 12; therefore, an analog delay (represented by a conventional delay element 18) is included in that line 12. Finally, FIG. 2C, like FIG. 2A, is a detailed view of a dynamic signal line (but, line 14 rather than line 10).

Although the structure and operation of the dynamic lines 10 and 14 depicted in FIGS. 2A and 2C should be well understood by those skilled in the art, a few additional observations may appropriately made here about the static lines 12 shown in FIG. 2B. In generally, static lines are always hot driven by some source. However, static lines can change at different times. For example, the uppermost depicted static line in FIG. 2B is a type of static line that changes during a precharge stage. This type of static line is a preferred type in embodiments of the present invention. The bottommost depicted static line in FIG. 2B is a type of static line that changes during the evaluation stage. This type of static line can change at the same time as an adjacent dynamic line; accordingly, element 18 is included in the line to delay any change in the static signal line to a time after any change in an adjacent dynamic signal line.

Figure 3:
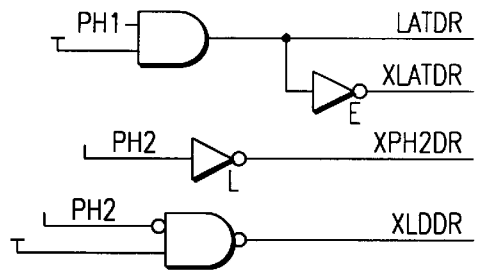
FIG. 3 is a detailed diagram of a circuit used to obtain parameters that can be used in embodiments of the present invention.
Figure 3:
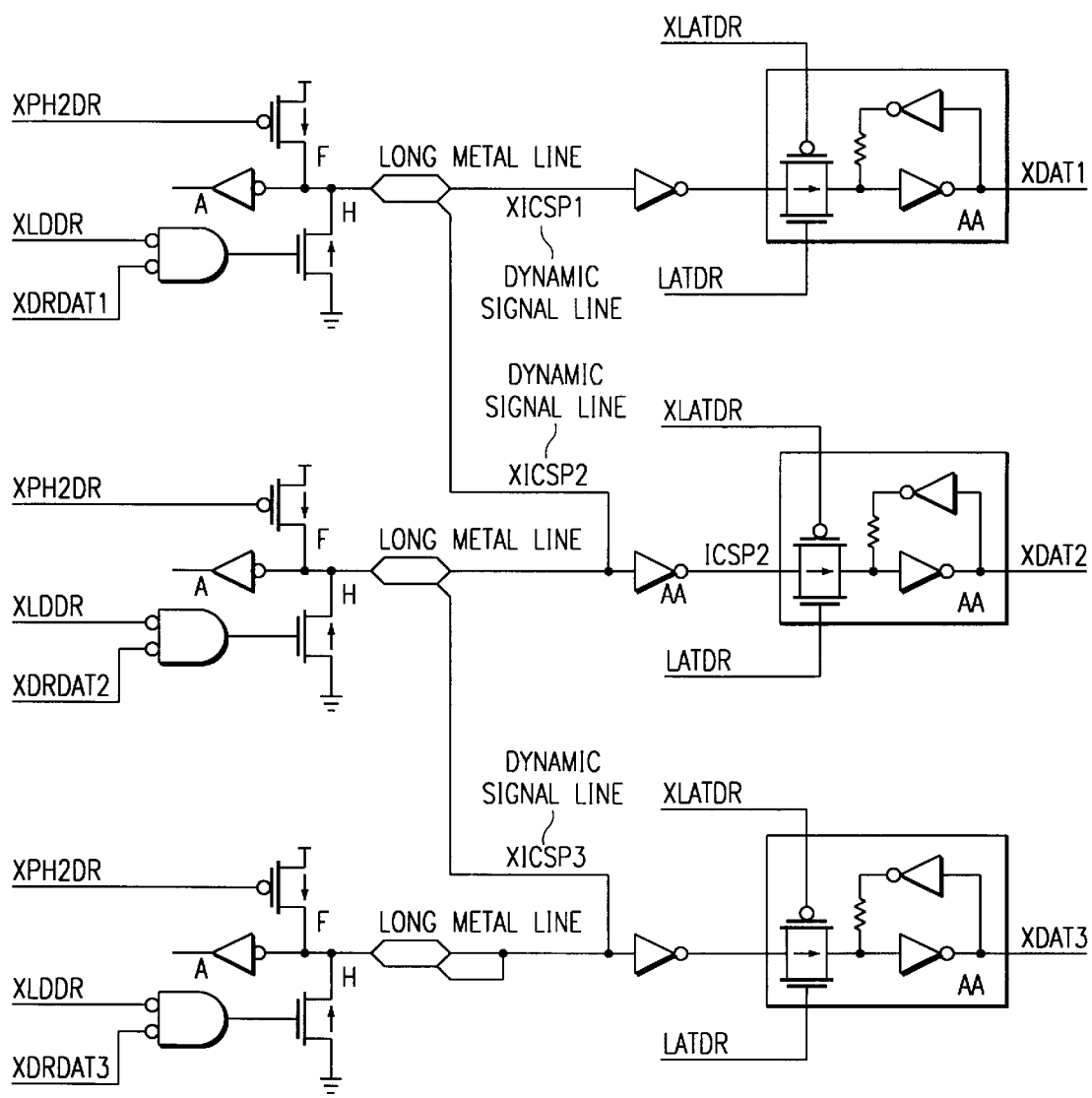

Referring now to FIG. 3, there is shown a simulated circuit of the present invention. In FIG. 3, lines XICSP1, XICSP2, and XICSP3 as shown in FIGURE are dynamic lines. The output of these dynamic lines go to a gate as shown which is used in the resultant device which is shown on the right hand side of the drawing and which consists of the XLATDR, and LATDR signals being outputted from the circuit AA, which contains multiple gates and which produces the signals XDAT1 . . . XDAT3. FIGS. 4 and 5 are related to FIG. 3 insofar as they depict voltage changes over time in the circuit. The various legends are shown by the solid, the dotted and the dash line and relate to the signals created in FIG. 3. FIG. 5 uses spacing of 3.5 microns between dynamic lines; FIG. 4 depicts conventional spacing of about 1.5 microns. In both FIGS. 4 and 5 the voltage of interest is the voltage level of a dynamic line surrounded by two other dynamic lines. FIG. 4 effectively simulates a situation where three dynamic lines are immediately adjacent. With larger distances involved, FIG. 5 effectively simulates static lines disposed between a central dynamic line and two outer dynamic lines. FIG. 4 shows that parasitic capacitance can cause XICSP to go low (at the point generally designated by reference numeral 20); FIG. 5, on the other hand, shows that although parasitic capacitance pulls down on XICSP, it does not go low. This "success" is because of the greater distances between dynamic lines, which greater distances can be readily achieved using the teachings of the present invention.

Although the discussion above has focused on lines routed in the same layer (i.e., on a single plane parallel to a substrate surface), those skilled in the art should understand and appreciate that the instant teachings can be used to solve crosstalk problems arising because of capacitance between or among lines in multiple layers. In fact, the inventors of the present invention envision that as the number of metal layers in processes increase, which seems to be a present trend, crosstalk arising because of capacitance between or among lines in multiple layers will become more of a problem.

Obviously, numerous modifications and variations are possible in view of the teachings above. Accordingly, within the scope of the appended claims, the present invention may be practiced otherwise than as specifically described hereinabove.

What is claimed is:

1. In an apparatus having dynamic signal lines for carrying dynamic signals, wherein said dynamic signals are part of a dynamic data bus, an improved signal line routing scheme comprising:

a plurality of dynamic signal lines disposed in parallel to each other;

at least one static signal line disposed parallel to and between at least two of said plurality of dynamic signal lines; and said at least one static signal line disposed immediately adjacent to at least one of said at least two dynamic signal lines such that the distance between the at least one static signal line and said at least two dynamic signal lines is selected so as to minimize the capacitance between said at least two dynamic signal lines.

2. An apparatus as recited in claim 1, further comprising means for ensuring that an immediately adjacent dynamic signal line and static signal line do not change signal level simultaneously.

3. An apparatus as recited in claim 2, wherein said means for ensuring that an immediately adjacent dynamic signal line and static signal line do not change signal level simultaneously comprises an analog delay element disposed on said static signal line.

4. A method of routing signal lines in an apparatus having dynamic signal lines for carrying dynamic signals, wherein said dynamic signals are part of a dynamic data bus, said method comprising the steps of:

laying a plurality of dynamic signal lines parallel to each other;

laying at least one static signal line parallel to and between at least two of said plurality of dynamic signal lines, and further so that said at least one static signal line is disposed immediately adjacent to at least one of said at least two dynamic signal lines such that the distance between the at least one static signal line and said at least two dynamic signal lines is selected so as to minimize the capacitance between said at least two dynamic signal lines.

5. The method as recited in claim 4, further comprising the step of changing the signal level of said at least one static signal line and changing the signal level of said immediately adjacent dynamic signal line non-simultaneously.

6. The method as recited in claim 5, further comprising the step of delaying the static signal so that said static signal does not change at the same time said dynamic signal changes.

* * * * *

UNITED STATES PATENT AND TRADEMARK OFFICE
CERTIFICATE OF CORRECTION

PATENT NO : 5,815,031

DATED : September 29, 1998

INVENTOR(S) : Tan, et al.

It is certified that error appears in the above-identified patent and that said Letters Patent are hereby corrected as shown below:

On the title page: Item [56]

Attorney, Agent, or Firm: Replace --Gikhrist-- with "Gilchrist"

Signed and Sealed this

Third Day of April, 2001

*Attest:*

NICHOLAS P. GODICI

*Attesting Officer*   *Acting Director of the United States Patent and Trademark Office*